United States Patent [19]

Lake, Jr.

[11] Patent Number: 4,703,447
[45] Date of Patent: Oct. 27, 1987

[54] MIXER CONTROLLED VARIABLE PASSBAND FINITE IMPULSE RESPONSE FILTER

[75] Inventor: David E. Lake, Jr., Penn Valley, Calif.

[73] Assignee: The Grass Valley Group, Inc., Grass Valley, Calif.

[21] Appl. No.: 720,663

[22] Filed: Apr. 5, 1985

[51] Int. Cl.$^4$ .......................... G06F 7/38; G06G 7/02
[52] U.S. Cl. .................................... 364/724; 364/825
[58] Field of Search ................ 364/724, 825, 725; 333/166; 328/167; 358/36; 324/77 D, 77 E

[56] References Cited

U.S. PATENT DOCUMENTS

| | | | |
|---|---|---|---|
| 4,016,410 | 4/1977 | Eggermont | 328/167 |
| 4,034,196 | 7/1977 | Butterweck et al. | 364/724 |
| 4,317,092 | 2/1982 | Potter | 333/166 |
| 4,356,558 | 10/1982 | Owen et al. | 364/724 |
| 4,359,778 | 11/1982 | Lee | 364/825 |
| 4,584,600 | 4/1986 | Baker | 364/724 |

Primary Examiner—Gary V. Harkcom
Assistant Examiner—Long Thanh Nguyen
Attorney, Agent, or Firm—Allston L. Jones; Francis I. Gray

[57] ABSTRACT

A mixer controlled, variable passband, finite impulse response filter has a plurality of individual filter function blocks which are cascaded. The filter function of each of the individual filter function blocks is represented by a fixed filter function block having a linear phase response. The junctions between successive filter function blocks form signal taps. The signal from each signal tap is delayed by a compensating delay device so that the signals from each of the plurality of signal taps have the same phase function. Signals from selected signal taps are then combined in a predetermined manner to achieve a desired filter transfer function.

21 Claims, 10 Drawing Figures

MIXER CONTROLLED VARIABLE PASSBAND FINITE IMPULSE RESPONSE FILTER

BACKGROUND OF THE INVENTION

This invention relates to electronic filters, and more particularly to digital filters having a controllable pass band.

In the field of information processing, it is widely recognized that information may be contained within any of a wide variety of formats, among which are electrical signals of either an analog or a digital nature. It is further recognized that there are applications in the field of information processing wherein it may be desirable to change the format in which information is contained. Typical of such applications are those wherein a somewhat specialized information processing operation may be necessary. In such applications, it is possible that the desired information processing operation may be more efficiently performed with information in one format than another. By way of illustraton, if information is contained within an analog format, and a desired operation thereon is most efficiently performed by employing digital techniques, it would be necessary to translate the information from the analog format to the digital format for the performance of the desired processing operation. Thereafter, the information could be again translated back to the original analog format. Consequently the process of translation of format of information, particularly between analog and digital formats, has received considerable attention.

There are a number of considerations attendant to the translation between analog and digital formats. One such consideration relates to the number of digital samples of an analog signal which are necessary to faithfully reconstruct an original analog signal from the collection of digital samples thereof. In this regard, it has long been recognized that, according to the widely recognized Nyquist Criteria, a sampling rate of greater than twice the highest frequency of interest in the original analog signal will suffice to reconstruct the original analog signal from the collection of digital samples thereof. However, in addition to the foregoing consideration with respect to a minimum sampling rate, it has been observed that further considerations are involved with respect to the frequency spectrum content of the original analog signal. In particular, it has been observed that while the sampling of an analog signal at a rate of greater than twice the highest frequency of interest therein will result in a sufficient number of samples to reconstruct the original signal therefrom, the presence of frequencies in the original analog signal above one-half of the sampling frequency results in undesirable effects in the subsequent reconstruction process of the original analog signal. In particular, the presence of such frequencies results in the subsequent generation of additional unwanted signals in the signal subsequently reconstructed from the digital samples. This phenomenon is referred to as "aliasing distortion", and requires for its avoidance that frequencies above one-half of the sampling frequency must be removed from the analog signal prior to the sampling thereof. The desired removal process is typically performed by a low pass filtering process having a cut off frequency greater than the highest frequency of interest in the original analog signal and less than one-half the sampling rate. This removal process, broadly referred to as anti-aliasing filtering, must be performed upon the analog signal prior to the sampling process.

In some applications involving anti-aliasing operations, the cut off frequency of the anti-aliasing filtering operation remains fixed. However, there are other applications which require an adjustable cut off frequency. An illustration of a typical application involving the generation of a video image of a reduced size will serve to illustrate the salient considerations involved. It should be understood, however, that while the following discussion with respect to a video image will illustrate the consideration associated therewith, there are likewise similar considerations associated with other applications which would be apparent to one of ordinary skill in the art. Consequently the following discussion with respect to video signal processing is not to be interpreted in a limiting manner.

It is frequently desirable in dealing with video images to reduce the size of a first video image by a selected amount, and to thereafter insert the resulting reduced size video image into a second video image. Typical of such operations are the familiar inserting of a first video image in a selected area of a second video image, frequently seen in television sports or news broadcasts. While the foregoing process may be performed in a variety of ways, one way typical of the process employing digital signal processing would involve the following steps. Assuming a desired video image to be inserted into the second video image is originally in an analog signal format, the video information contained therein would first be filtered employing analog filtering techniques to remove frequency components above a selected frequency of interest. Thereafter, the analog signal waveform would be sampled at a rate determined by the highest frequency of interest therein, and the digital samples so obtained stored in a suitable manner. This first anti-aliasing filtering operation is of course required to ensure that in a subsequently reconstructed video image identical to the original, frequencies present above the selected frequency are removed and cannot generate unwanted signals in the subsequently reconstructed video image. However, a second anti-aliasing filtering process is required in connection with the production of a video image of reduced size. This second anti-aliasing filtering process follows from the requirement that frequencies associated with the anti-aliasing phenomenon must be removed prior to the sampling process associated therewith. In particular, the production of a video image of reduced size involves selection of digital values from among the collection of digital samples previously collected. This selection process is equivalent to a re-sampling process. Consequently, prior to the selection of digital values for the construction of the reduced size video image, from among the set of ditigal samples previously collected, it is necessary to again perform an anti-aliasing filtering operation upon the set of digital samples previously collected. The cut off frequency associated with the anti-aliasing filter in this second anti-aliasing filtering process is determined by the desired size of the reduced video image. Consequently it is observed that in the process of producing video images of selected reduced size requires an anti-aliasing filter having an adjustable cut off frequency.

While the foregoing has described the necessity of the filtering process in connection with the production of a video image of a reduced or compressed size, it will be recognized by one skilled in the art that similar filtering operations are likewise necessary in connection with fixed rotations of video images. Broadly stated, it is recognized that in dealing with either compressions or rotations of video images of a fixed amount, an anti-aliasing filtering process in necessary. In particular, the cut off frequency associated with the anti-aliasing filtering apparatus is determined by the desired amount of rotation or compression of the video iamge. It should be noted in this respect that for a selected amount of compression or rotation of a video image, the corresponding cut off frequency of the anti-aliasing filter is a constant. In particular, it is only necessary to change the cut off frequency of the anti-aliasing filtering apparatus when the amount of compression or rotation of the video image is changed. Consequently, it is recognized that for a selected amount of compression or rotation of a video image, the cut off frequency of the associated anti-aliasing filtering apparatus is a constant frequency determined by the parameters associated with the amount of compression or rotation of the associated video image.

However, while video image processing involving the compression or rotation of a video image by a fixed amount requires a corresponding static alteration of the cut off frequency of the associated anti-ailasing filtering apparatus, it will likewise be recognized by one skilled in the art that there are applications in video image processing wherein the cut off frequency associated with the anti-aliasing filtering operation is not a constant, but requires alteration in a dynamic manner. Broadly stated, applications which involve three dimensional perspective operations require that the cut off frequency of the anti-aliasing filtering apparatus be altered in a dynamic manner. In particular, in applications wherein it is desirable to process a selected video image in such a manner to produce the effect of a perspective projection. e.g., it is desired that the selected video image appear as projected into a three dimensional space in such a manner as to appear rotated either inward to or outward from the three dimensional space, the necessary resulting video image will require compression and rotation in varying amounts determined by the amount of desired projection with respect to the three dimensional space. In the video image processing associated with the production of such an image, the cut off frequency of the anti-aliasing filter must be dynamically adjusted in accordance with the changing amounts of compression and rotation necessary to achieve the three dimensional effect. Consequently, the processing of video images in such a manner to achieve three dimensional perspective effects requires dynamic alteration of the cut off frequency of the associated anti-aliasing filtering apparatus.

It will likewise be recognized by one skilled in the art that as the selected video image is comprised of a set of discrete samples which occur at a constant rate in a video scan line order, the aforedescribed anti-aliasing filtering operation must likewise occur at the same constant rate. It should be particularly noted in this regard with respect to video image processing involving three dimensional perspective effects, that the cutoff frequency of the anti-aliasing filter must correspondingly vary as the sequence of samples flows into the anti-aliasing filter. Consequently, as the discrete samples are necessarily supplied at a relatively high rate, the associated cut off frequency of the anti-aliasing filter must correspondingly be capable of varying at the same relatively high rate. This has been accomplished in the past in a number of ways. Once such approach has employed the use of Infinite Impulse Response digital filters, hereinafter referred to as IIR filters. Broadly speaking, an IIR filter typically involves the use of a storage element in a main signal path through the IIR filter, with associated feedback paths to achieve the desired filtering. Digital multipliers are typically employed in the design of IIR filters. In such a design, the response of an IIR filter may be dynamically altered by changing a multiplicand associated with one or more of the digital multipliers. However, while an IIR filter does provide a filtering operation with a degree of dynamic control over the cut off frequency associated therewith, IIR filters further have associated therewith a number of disadvantages, including a phenomenon relating to the storage of previous responses. Such disadvantages tend to make the use of IIR filters less than desirable in implementing anti-aliasing filter operations where a high degree of dynamic control over the cut off frequency is necessary.

In an alternate approach, a Finite Impulse Response digital filter is frequently employed. A Finite Impulse Response digital filter, hereinafter referred to as a FIR filter, is generally comprised of a plurality of digital delay devices, a digital adder, and a plurality of digital multiplier devices. In such a filter, the cut off frequency may be altered by adjustment of the values of the multiplicands associated with the multiplier devices. It has been found that the FIR filter does indeed provide the required high degree of dynamic control required over the cut off frequency associated with an anti-aliasing filter operation. However, there is likewise a significant practical disadvantage associated with the use of FIR filter designs. In particular, prior art FIR filter designs require the use of a plurality of multipler devices; frequently one multiplier device per digital delay device employed in the FIR filter. The disadvantage which follows from the use of an FIR filter design to implement a anti-aliasing filter operation results from the economic cost associated with the digital multiplier devices required therein. In particular, digital multiplier devices are comparatively expensive. Consequently, while anti-aliasing filters implemented as FIR filters do offer higher desirable performance characteristics, the price of the digital multiplier devices required therein has been a significant unavoidable disadvantage. There is consequently a need for a filter having a dynamically controllable variable cut off frequency which requires fewer digital multiplier devices than the FIR approach.

SUMMARY OF THE INVENTION

According to the present invention an apparatus is disclosed which provides for flexible passband control in a filter in a manner requiring a minimum number of digital multiplier devices. Broadly stated, a plurality of individual filter function blocks are cascaded. The filter function of each of the individual filter function blocks may be represented by a fixed filter transfer function having a linear phase response, i.e., all frequencies passing through the filter function block are delayed by an equal amount. The junctions between successive filter function blocks form signal taps. The signal from each signal tap is delayed by a compensating delay device so that the signals from each of the plurality of signal taps have the same phase function. Signals from selected signal taps are then combined in a predetermined manner to achieve a desired filter transfer function.

In particular, a plurality of filter functions are first selected to implement each of the plurality of filter function blocks. The individual filter functions are chosen in such a manner that a desired filter function will result when signals from selected signal taps are combined in a predetermined manner. The filter function chosen for each of the filter function blocks must further have associated therewith a linear phase response. The selected filter functions are then implemented in corresponding filter function blocks, and the filter function blocks configured in a cascaded manner. Signals from the signal taps are each delayed by predetermined amounts. Thereafter, selected filter functions may be achieved by combining predetermined amounts of individual signals from selected signal taps subsequent to the delay thereof.

DESCRIPTION OF THE PREFERRED EMBODIMENT

Figure 1:
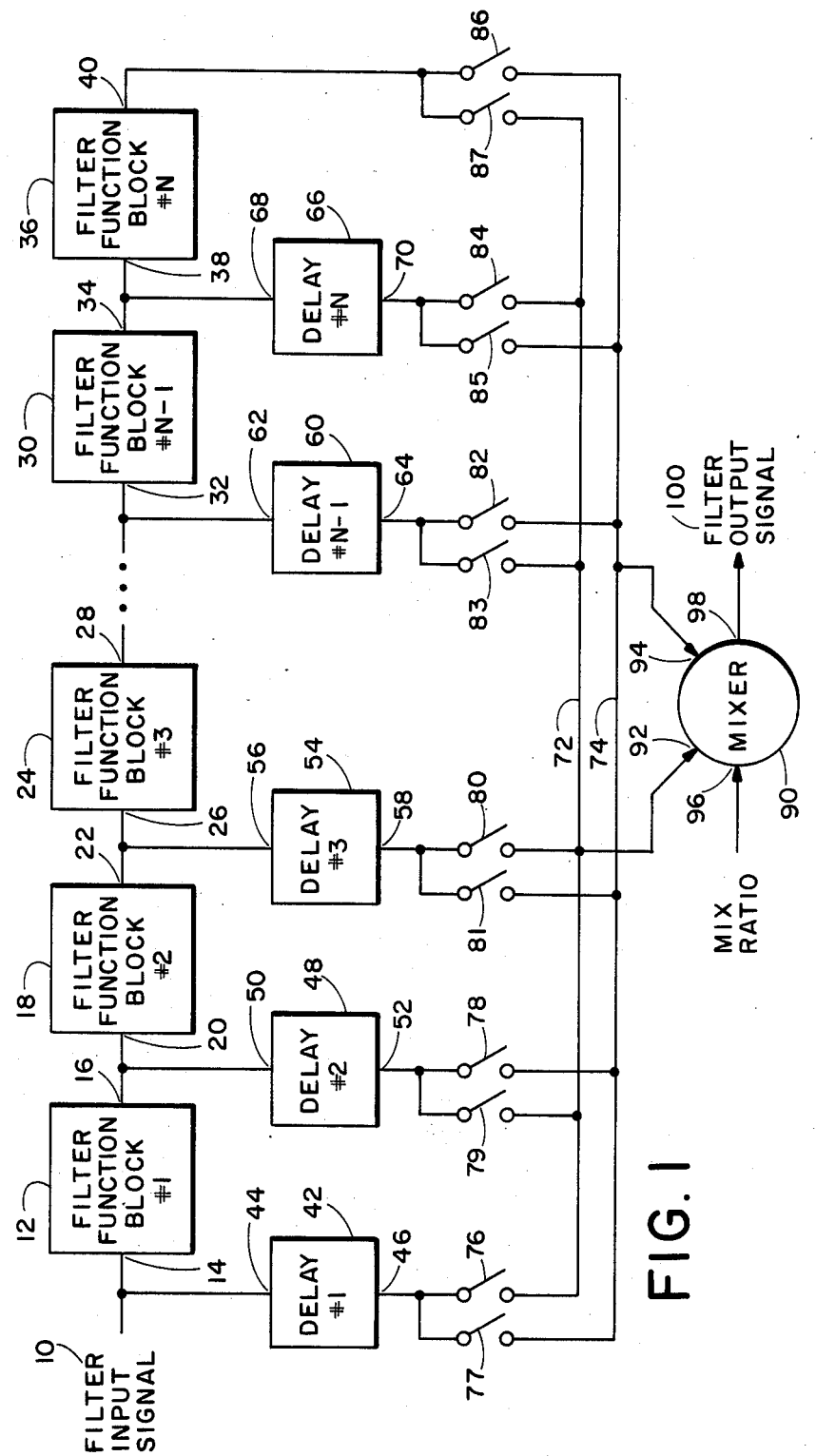
FIG. 1 illustrates a broad functional block diagram of a filter apparatus in accordance with the method and apparatus of the present invention.

In accordance with the present invention, a method and apparatus are disclosed for producing selectable filter functions with a minimum number of multipling devices. FIG. 1 broadly illustrates functional apparatus in accordance with the present invention. Referring to FIG. 1, filter input signal 10 represents a signal upon which a desired filtering operation is to be performed. Filter Function Block #1 12 represents a first filtering operation which performs a first filtering function according to a filter transfer function associated therewith, hereinafter referred to as filter transfer function #1. Filter Function Block #1 12 has associated therewith filter function block #1 input terminal 14 and filter function block #1 output terminal 16. Filter Function Block #1 12, responsive to filter input signal 10 coupled to filter function block #1 input terminal 14, functions to produce a corresponding signal on filter function block #1 output terminal 16 according to filter transfer function #1. In a similar manner, additional subsequent filter function blocks indicated generally in FIG. 1 as Filter Function Block #2 18, Filter Function Block #3 24, Filter Function Block #N−1 30 and Filter Function Block #N 36 likewise represent filtering operations which perform subsequent filtering functions according to filter transfer functions associated therewith, hereinafter referred to as filter transfer function #2, filter transfer function #3, filter transfer function #N−1 and filter transfer function #N, respectively, In a similar manner as Filter Function Block #1 12, Filter Function Block #2 18, Filter Function Block #3 24, Filter Function Block #N−1 30 and Filter Function Block #N 36 each have associated therewith corresponding input and output terminals, i.e., filter function block #2 input terminal 20, filter function block #2 output terminal 22, filter function block #3 input terminal 26, filter function block #3 output terminal 28, filter function block #N−1 input terminal 32, filter function block #N−1 output terminal 34, filter function block #N input terminal 38 and filter function block #N output terminal 40, respectively. According to the method and apparatus of the present invention, the foregoing described filter function blocks are configured in a cascaded sequence, i.e., filter function block #1 output terminal 16 is coupled to filter function block #2 input terminal 20. In a similar manner, the output terminals of subsequent filter function blocks are coupled to the input terminals of the following filter function block input terminal. In this regard it is understood that according to the method and apparatus of the present invention, any number of filter function blocks may be cascaded to achieve a desired filter function, as indicated generally by Filter Function Block #N−1 30 and Filter Function Block #N 36, and more fully discussed hereinafter. According to the method and apparatus of the present invention, each of the filter transfer functions associated with each of the filter function blocks has a linear phase response. Consequently a signal passing through any or all of the foregoing filter function blocks will have the respective frequencies contained therein delayed by a constant amount. The individual filter functions selected to be implemented in each of the filter function blocks are chosen in a fashion such that when combined in a hereinafter described manner, a desired overall filter response will result. The filter functions implemented in each of the foregoing described filter function blocks may be implemented using either analog or digital techniques, well known to one of ordinary skill in the art. The coupling between a filter function block output terminal and the filter function block input terminal of the next succeeding filter function block forms a signal tap which is coupled to a delay device, as more fully described hereinafter. In addition, filter input signal 10 is also coupled to a delay device. In particular, Delay #1 42 has associated therewith delay #1 input terminal 44 and delay #1 output terminal 46. Filter input signal 10 is coupled to filter function block #1 input terminal 14 and also to Delay #1 input terminal 44. Delay #1 42 functions to produce a signal on delay #1 output terminal 46 identical to the signal coupled to delay #1 input terminal 44, delayed in time by a preselected amount equal to the total time required for filter input signal 10 to propagate through all of the individual filter function blocks to filter function block #N output terminal 40. Consequently, filter input signal 10 will appear coincident at filter function block #N output terminal 40 and delay #1 output terminal 46. In a similar manner, Delay #2 48 has associated therewith delay #2 input terminal 50 and delay #2 output terminal 52, and functions to produce a signal on delay #2 output terminal 52 identical to the signal coupled to delay #2 input terminal 50, delayed in time by a preselected amount. Delay #2 input terminal 50 is coupled to the signal tap formed between filter function block #1 output terminal 16 and filter function block #2 input terminal 20. The preselected amount of time by which Delay #2 48 delays the signal coupled to delay #2 input terminal 50 is selected to be equal to the preselected delay time associated with Delay #1 42, reduced by an amount equal to the period of time required for a signal coupled to filter function block #1 input terminal 14 to propagate through Filter Function Block #1 12. Consequently, filter input signal 10 will likewise appear coincident at filter function block #N output terminal 40, delay #1 output terminal 46, and delay #2 output terminal 52. In a similar fashion, Delay #3 54, Delay #N−1 60 and Delay #N 66 have associated therewith delay #3 input terminal 56, delay #3 output terminal 58, delay #N−1 input terminal 62, delay #N−1 output terminal 64, delay #N input terminal 68 and delay #N output terminal 70, respectively. Each of Delay #3 54, Delay #N−1 60 and Delay #N 66 have associated therewith predetermined times by which each delays the signal coupled to the respective input terminals thereto, each of which predetermined delay times is chosen in a manner such that filter input signal 10 will appear coincident at the output terminal of the respective delay devices and at filter function block #N output terminal 40. From the foregoin it is recognized that the signals which are present on the respective output terminals of each of Delay #1 42, Delay #2 48, Delay #3 54, Delay #N−1 60 and Delay #N 66, i.e., delay #1 output terminal 46, delay #2 output terminal 52, delay #3 output terminal 58, delay #N−1 output terminal 64 and delay #N output terminal 70, each represent the corresponding signal at the same corresponding point in time, each having been filtered according to the filter function blocks through which the signal has passed. The foregoing described delay devices, i.e., Delay #1 42, Delay #2 48, Delay #3 54, Delay #N−1 60 and Delay #N 66, may be implemented using either analog or digital techniques by employing any of a wide variety of analog or digital delay devices well known to one of ordinary skill in the art. The output signals from each of the foregoing described delay devices are selectively coupled to one of two signal buses 72 or 74 by switches 76, 77, 78, 79, 80, 81, 82, 83, 84, 85, 86 and 87. In particular, the output signal from Delay #1 42 (i.e. delay #1 output terminal 46) may be selectively coupled to signal bus 72 by switch 76 and to signal bus 74 by switch 77. In a similar manner, the output signal from Delay #2 48, Delay #3 54, Delay #N−1 60 or Delay #N 66 (i.e. delay #2 output terminal 52, delay #3 output terminal 58, delay #N−1 output terminal 64 and delay #N output terminal 70) respectively, may be selectively coupled to signal bus 72 by switch 79, 80, 83 or 84, respectively, and to signal bus 74 by switch 78, 81, 82 or 85, respectively. Output terminal 40 of filter function block #N 36 may likewise be coupled to signal buss 72 by switch 87 and to signal bus 74 by switch 86. In a similar manner as previously discussed with respect to the filter function blocks and delay devices, the switches which couple the output from the delay devices to the respective signal buses may be implemented using either analog or digital techniques by any of a wide variety of analog or digital devices well known to one of ordinary skill in the art. Mixer 90 is a signal mixing device having a first mixing input terminal 92, a second mixing input terminal 94, a mixing ratio input terminal 96 and a mixer output terminal 98. Mixer 90 operates in the following manner. Mixer 90, responsive to signals coupled to first mixing input terminal 92 and second mixing input terminal 94, functions to combine the signals coupled thereto according to the signal coupled to mixing ratio input terminal 96. In particular, Mixer 90 combines the foregoing signals according to $$\text{Filter Output Signal} = aA + (1-a)B \qquad (1)$$

where "a" represents the signal coupled to mixing ratio input terminal 96, and A and B represent the signals coupled to first and second mixing input terminals 92 and 94, respectively. According to Equation (1) above, Mixer 90 functions to produce a mixer output signal on mixer output terminal 98 of Mixer 90, referred to as "Filter Output Signal" in Equation (1), equal to the sum of the product of two terms: a first product term comprised of the product of a term represented by the signal coupled to mixing ratio input terminal 96 and a term represented by the signal coupled to first mixing input terminal 92; and a second term equal to the product of a term represented by the signal coupled to second mixing input terminal 94 and the difference between the integer one and the term represented by the signal coupled to mixing ratio input terminal 96. Mixer 90 may be implemented by any of a wide variety of devices well known to one of ordinary skill in the art, including a typical video mixer apparatus. According to the method and apparatus of the present invention, signal buses 72 and 74 are coupled to the inputs of Mixer 90, i.e. signal bus 72 is coupled to first mixing input terminal 92, and signal bus 74 is coupled to second mixing input terminal 94 of Mixer 90. The signal produced by Mixer 90 at mixer output terminal 98, responsive to a selected mix ratio coupled to mixing ratio input terminal 96 of Mixer 90 and the coupling of ouput signals from selected delay devices, forms a desired filter output signal 100, as will be more fully discussed hereinafter.

According to the method and apparatus of the present invention, as each of the filter transfer functions associated with each of the filter function blocks has a linear phase response, it is possible to combine the respective responses of the filter function blocks to achieve a desired response, provided that each response so combined is equally delayed in time by the same period. As each of the foregoing described delay devices function to provide the desired time delay among the output signals from each of the filter function blocks, the output signals therefrom may be so combined.

Broadly stated, according to the method and apparatus of the present invention, a broad filter function is first chosen having a parameter associated therewith which is desired to be variable, e.g., a low pass filter having the desired variable of a selectable cut off frequency. Thereafter, filter transfer functions are determined for each of the filter function blocks to be incorporated therein, each having the required linear phase response. The filter functions for each of the filter function blocks are chosen in such a manner so that the response from combined filter function blocks will produce the desired broad filter function. In particular, for each desired response characteristic of the broad filter function, the necessary signals from the foregoing described delay output terminals and a mix ratio is determined. Thereafter, a desired response may be achieved by combining signals produced by appropriate filter functions by coupling the responses therefrom, delayed by the associated delay devices, to Mixer 90, and mixing the same according to the preselected mix ratio, as more fully described hereinafter.

Figure 2:
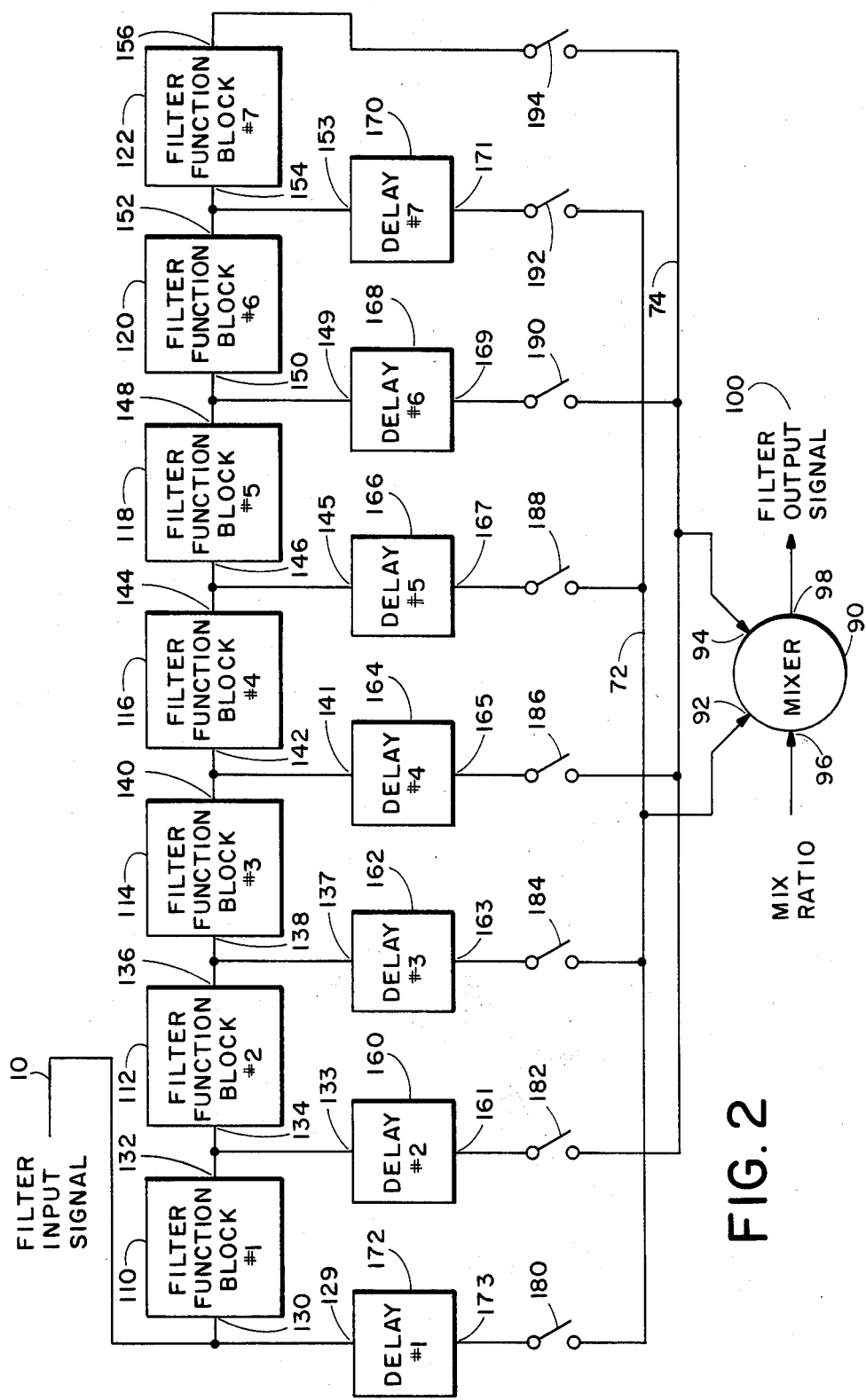
FIG. 2 illustrates a functional block diagram of a preferred embodiment of a low pass filter incorporating the method and apparatus of the present invention.

A low pass filter was chosen as the broad filter function for implementation in a preferred embodiment according to the method and apparatus of the present invention, having a selectable cut off frequency associated therewith, as more particularly illustrated in FIG. 2. In this regard it is to be understood that the following discussion of the preferred embodiment of a low pass filter is to illustrate the application of the method and apparatus of the present invention to the implementation of a particular type of filter having a selected set of characteristics. It is to be understood, however, that the method and apparatus of the present invention may be similarly applied by one of ordinary skill in the art to the implementation of a broad range of filter functions, limited only by the selection of particular filter transfer functions for impelementation in each of the filter function blocks employed in a particular design, and the subsequent combination of their output signals by Mixer 90. Consequently, the following discussion with respect to the implementation of a preferred embodiment of the low pass filter having a selected set of parameters associated therewith is not to be interpreted in a limiting manner.

Referring to FIG. 2, a plurality of filter function blocks are employed and arranged in a cascaded sequence. In particular Filter Function Block #1 110, Filter Function Block #2 112, Filter Function Block #3 114, Filter Function Block #4 116, Filter Function Block #5 118, Filter Function Block #6 120 and Filter Function Block #7 122 are arranged in a cascaded order. Each of the filter function blocks have a corresponding input and output terminal associated therewith, i.e., Filter Function Block #1 110 has filter function block #1 input terminal 130 and filter function block #1 output terminal 132 associated therewith. In a like manner, Filter Function Block #2 112, Filter Function Block #3 114, Filter Function Block #4 116, Filter Function Block #5 118, Filter Function Block #6 120 and Filter Function Block #7 122 have associated therewith filter function block #2 input terminal 134, filter function block #2 output terminal 136, filter function block #3 input terminal 138, filter function block #3 output terminal 140, filter function block #4 input terminal 142, filter function block #4 output terminal 144, filter function block #5 input terminal 146, filter function block #5 output terminal 148, filter function block #6 input terminal 150, filter function block #6 output terminal 152, filter function block #7 input terminal 154, and filter function block #7 output terminal 156, respectively. The output terminal from Filter Function Block #1 is coupled to the input terminal of Filter Function Block #2, i.e., filter function block #1 output terminal 132 is coupled to filter function block #2 input terminal 134. In a similar manner, filter function block #2 output terminal 136, filter function block #3 output terminal 140, filter function block #4 output terminal 144, filter function block #5 output terminal 148, filter function block #6 output terminal 152 are coupled to filter function block #3 input terminal 138, filter function block #4 input terminal 142, filter function block #5 input terminal 146, filter function block #6 input terminal 150 and filter function block #7 input terminal 154, respectively. The coupling between adjacent filter function blocks forms signal taps as previously discussed with respect to FIG. 1, each of which is coupled to a corresponding delay device, as was likewise discussed with respect to FIG. 1. In particular, Delay #1 172 has associated therewith delay #1 input terminal 129 and delay #1 output terminal 173. Filter Input Signal 10 is coupled to filter function block #1 input terminal 130 and to delay #1 input terminal 129. Delay #1 172 functions in an identical manner as Delay #1 42 previously discussed with respect to FIG. 1, i.e., Delay #1 functions to produce a signal on delay #1 output terminal 173 identical to the signal coupled to delay #1 input terminal 129 delayed in time by a preselected amount equal to the total time required for filter input signal 10 to propagate through all of the individual filter function blocks to filter function block #7 output terminal 156. Consequently, filter input signal 10 will appear coincident at filter function block #7 output terminal 156 and delay #1 output terminal 173. In a similar manner, Delay #2 160 has associated therewith delay #2 input terminal 133 and delay #2 output terminal 161, and functions to produce a signal on delay #2 output terminal 161 identical to the signal coupled to delay #2 input terminal 133, delayed in time by a preselected amount. Delay #2 input terminal 133 is coupled to the signal tap formed between filter function block #1 output terminal 132 and filter function block #2 input terminal 134. The preselected amount of time by which Delay #2 160 delays the signal coupled to delay #2 input terminal 133 is selected to be equal to the preselected delay time associated with Delay #1 172, reduced by an amount equal to the period of time required for a signal coupled to filter function block #1 input terminal 130 to propagate through Filter Function Block #1 110. Consequently, filter input signal 10 will likewise appear coincident at filter function block #7 output terminal 156, delay #1 output terminal 173, and delay #2 output terminal 161. In a similar manner, Delay #3 162, Delay #4 164, Delay #5 166, Delay #6 168 and delay #7 170 have associated therewith delay #3 input terminal 137, delay #3 output terminal 163, delay #4 input terminal 141, delay #4 output terminal 165, delay #5 input terminal 145, delay #5 output terminal 167, delay #6 input terminal 149, delay #6 output terminal 169, delay #7 input terminal 153 and delay #7 output terminal 171, respectively. Each of Delay #3 162, Delay #4 164, Delay #5 166, Delay #6 168 and Delay #7 170 have associated therewith predetermined times by which each delays the signal coupled to the respective input terminal thereto, each of the predetermined delay times is chosen in a manner such that the filter input signal 10 will appear coincident at the output terminal of the respective delay device and at filter function block #7 output terminal 156. Consequently, as was the case previously discussed with respect to FIG. 1, the signals which are present on the respective output terminals of each of Delay #1, Delay #2, Delay #3, Delay #4, Delay #5, Delay #6 and Delay #7 (i.e., delay #1 output terminal 173, delay #2 output terminal 161, delay #3 output terminal 163, delay #4 output terminal 165, delay #5 output terminal 167, delay #6 output terminal 169 and delay #7 output terminal 171) represent the corresponding signal at the same corresponding point in time, each having been filtered according to the filter function blocks through which the signal has passed. In particular, the output from each of the foregoing described delay devices is selectively coupled to one of two signal buses, 72 or 74, by switches 180, 182, 184, 165, 188, 190, 192 and 194. In particular, switches 180, 184, 188 and 192 operate to selectively couple the signal from Delay #1 172, Delay #3 162, Delay #5 166 and Delay #7 170, respectively, to signal bus 72, and switches 182, 186, 190 and 194 operate to selectively couple the signal from Delay #2 160, Delay #4 164 and Delay #6 168, respectively, to signal bus 74. Signal buses 72 and 74 are likewise coupeld to first mixing input terminal 92 and second mixing input terminal 94 of Mixer 90, respectively, as previously discussed with respect to FIG. 1. A mix ratio signal defining the relative amount of the signals coupled to first and second mixing input terminals 92 and 94, respectively, of Mixer 90 is coupled to mixing ratio input terminal 96. The output from Mixer 90 on mixer output terminal 98 forms the desired filter output signal 100.

In the preferred embodiment, each of the filter function blocks is implemented as a Finite Impulse Response digital filter. Consequently, the phase response of each filter function block is linear. In the preferred embodiment, a set of filter transfer functions were chosen according to $$H(z) = z^{-n} + 1$$

for n even, and $$H(z) = z^{-2n} + 2z^{-n} + 1$$

for n odd. By choosing equations based upon the foregoing, it was found that filter transfer functions for each of the individual filter function blocks could be implemented in a simple and economical manner. In particular, individual filter transfer functions were empirically selected based upon the foregoing equations and ease of implementation, as will be more fully discussed hereinafter.

The filter transfer function selected for Filter Function Block #1 110 is $$(z^{-2} + 2z^{-1} + 1)/4$$

Figure 3:
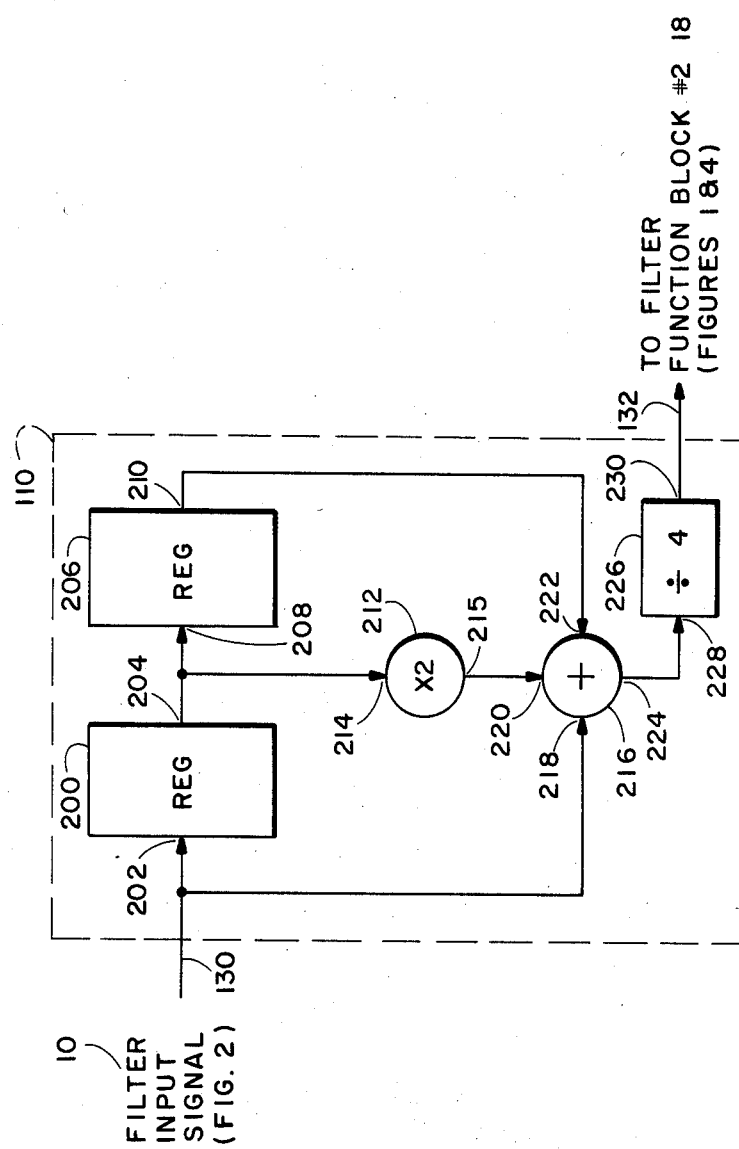
FIG. 3 illustrates a diagram of the implementation of Filter Function Block #1 of FIG. 2.

FIG. 3 illustrates the implementation of Filter Function Block #1 110 in the preferred embodiment. Referring to FIG. 3, Register 200 has associated therewith input terminal 202 and output terminal 204, and functions responsive to a digital word coupled to input terminal 202 to couple the same to output terminal 204. Register 206 likewise has associated therewith input terminal 208 and output terminal 210, and functions in an identical manner to Register 200. Registers 200 and 206 may be implemented by any of a wide variety of digital devices, including the Model 74F374 8-Bit Register integrated circuit manufactured by Fairchild Digital Products of South Portland, Maine. Multiplier 212 has associated therewith input terminal 214 and output terminal 215, and functions to multiply the digital number represented by the signal coupled to input terminal 214 by the numerical constant of two, producing a signal representative of the product thereof on output terminal 215. While Multiplier 212 may be implemented by a wide variety of digital multiplier devices, in the preferred embodiment the function of Multiplier 212 was achieved by shifting the associated bit pattern of the signal coupled to input terminal 214 toward the most significant bit (MSB) by one, as performing same in binary arithmetic has the identical effect of multiplication by two. Adder 216 has associated therewith input terminals 218, 220 and 222, and output terminal 224, and functions to produce on output terminal 224 the digital sum of the number represented by the digital signals coupled to input terminals 218, 220 and 222. Adder 216 may be implemented by any of a wide variety of digital devices, including the Model 74F283 4-Bit Digital Adder manufactured by Fairchild Digital Products. Divide-by-Four 226 has associated therewith input terminal 228 and output terminal 230, and functions to couple to output terminal 230 a signal representative of division of the representative numerical value of the digital signal coupled to input terminal 228 by the integer four. While Divide-by-Four 226 may be implemented by any of a wide variety of digital devices, in the preferred embodiment the function of Divide-by-Four 226 is achieved by shifting the associated bit pattern of the signal coupled to input terminal 228 two positions toward the least significant bit (LSB), as performing same in binary arithmetic has the identical effect of division by four. The aforedescribed apparatus of FIG. 3 is configured in the following manner. Input terminal 202 of Register 200 is coupled to input terminal 218 of Adder 216, and corresponds to filter function block #1 input terminal 130 (FIG. 2). Output terminal 204 of Register 200 is coupled to input terminal 208 of Register 206, and to input terminal 214 of Mulitply-by-Two 212. Output terminal 215 of Multiply-by-Two 212 is coupled to input terminal 220 of Adder 216. Output terminal 210 of Register 206 is coupled to input terminal 222 of Adder 216. Output terminal 224 of Adder 216 is coupled to input terminal 228 of Divide-by-four 226. Output terminal 230 of Divide-by-Four 226 corresponds to filter function block #1 output terminal 132 (FIG. 2). The individual frequency response of the foregoing described apparatus of FIG. 3 is that of a low pass filter, having a gain of −10 db at a normalized frequency of approximately 0.62.

The filter transfer function selected for Filter Function Block #2 112 is $$(z^{-2} + 1.5 z^{-1} + 1) / 3.5$$

Figure 4:
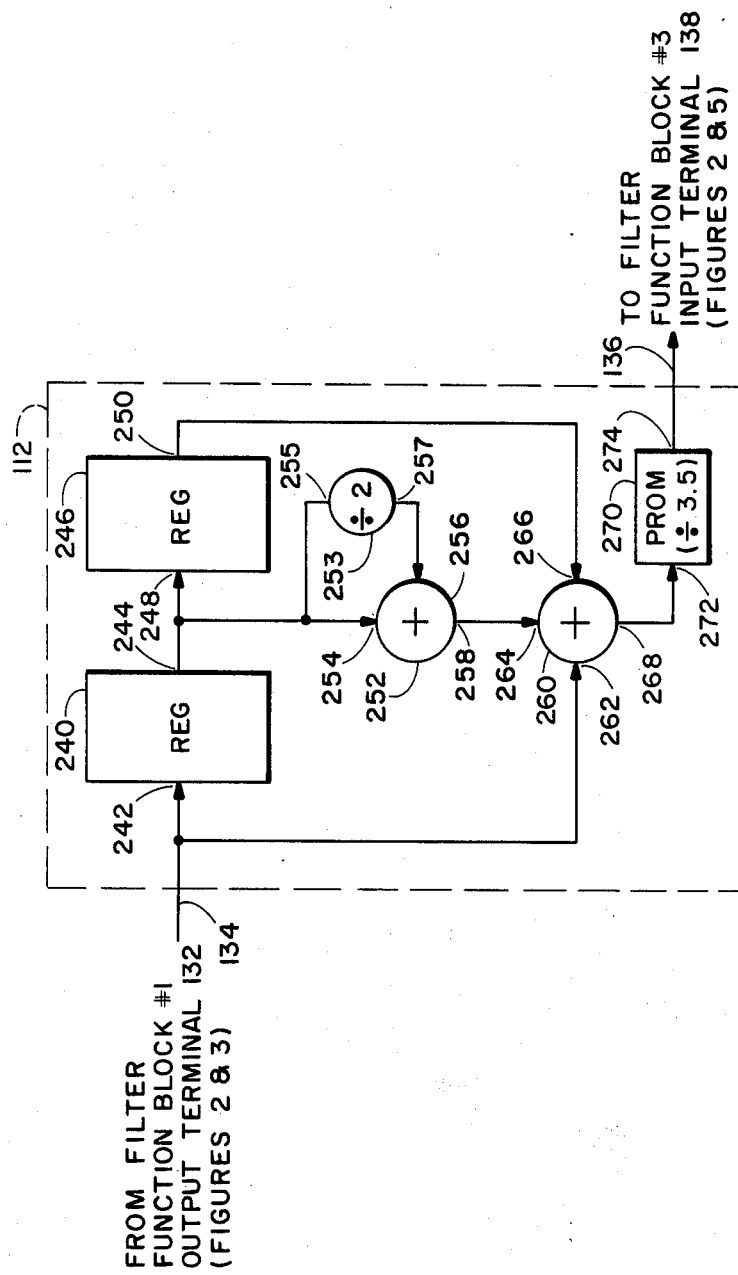
FIG. 4 illustrates a diagram of the implementation of Filter Function Block #2 of FIG. 2.

FIG. 4 illsutrates the implementation of Filter Function Block #2 112 in the preferred embodiment. Referring to FIG. 4, Register 240 and 246 have associated therewith input terminals 242 and 248, respectively, and output terminals 244 and 250, respectively. Registers 240 and 246 are identical to, and may be implemented in a similar manner as, Register 200 previously discussed with respect to FIG. 3. Divide-by-two 253 has associated therewith input terminal 255 and output terminal 257. Divide-by-two 253 functions responsive to digital words coupled to input terminal 255 to produce a word representative of the quotient of the digital word divided by the integer two. While Divide-by-two 253 may be implemented by any of a wide variety of digital devices, in the preferred embodiment the function of Divide-by-two 253 is achieved by shifting the associated bit pattern of the signal coupled to input terminal 255 by one, as performing same in binary arithmetic has the identical effect of division by two. Adder 252 has associated therewith input terminals 254 and 256, and output terminal 258. Adder 252 functions responsive to digital words coupled to input terminals 254 and 256 to produce a word representative of the digital sum thereof on output terminal 258. Adder 252 may be implemented by any of a wide variety of digital devices, including use of the Model 74F283 4-Bit Digital Adder previously referenced. Adder 260 likewise has associated therewith input terminals 262, 264 and 266, and output terminal 268, and functions responsive to digital words coupled to input terminals 262, 264 and 266 to produce a word representative of the digital sum thereof on output terminal 268. Adder 260 is identical to and may be implemented in a similar manner as Adder 216 previously discussed with respect to FIG. 3. PROM 270 has associated therewith PROM input terminal 272 and PROM outptu terminal 274, and functions responsive to a digital word coupled to PROM input terminal 272 to produce a word representative of the digital quotient of the same divided by the numerical constant of 3.5 on PROM output terminal 274. PROM 270 may be implemented by any of a wide variety of storage devices, including the Model 2732 Erasable Programmable Read Only Memory manufactured by INTEL Corporation of Santa Clara, Calif. The information previously described contained within PROM 270 would be stored therein by use of suitable PROM programming devices, as are well known in the art. The foregoing described apparatus of FIG. 4 is configured in the followed manner. Input terminal 242 of Register 240 is coupled to input terminal 262 of Adder 260, and corresponds to filter function block #2 input terminal 134 of Filter Function Block #2 112 (FIG. 2). Output terminal 244 of Register 240 is coupled to input terminal 248 of Register 246, input terminal 254 of Adder 252 and input terminal 255 of Divide-by-two 253. Output terminal 257 of Divide-by-two 253 is coupled to input terminal 256 of Adder 252. Output terminal 250 of Register 246 is coupled to input terminal 266 of Adder 260. Output terminal 258 of Adder 252 is coupled to input terminal 264 of Adder 260. Output terminal 268 of Adder 260 is coupled to input terminal 272 of PROM 270. Output terminal 274 of PROM 270 corresponds to filter function block #2 output terminal 136 of Filter Function Block #2 112 (FIG. 2). The individual frequency response of the foregoing described apparatus of FIG. 4 is that of a comb filter, having a single zero at a normalized frequency of approximately 0.7, e.g., a signal having a normalized frequency of approximately 0.7 is not passed through the foregoing described filter function block. The frequency response of the cascaded combination of Filter Function Block #1 110 and Filter Function Block #2 112 at filter function block #2 output terminal 136 is that of a low pass filter having a gain of −10 db at a normalized frequency of approximately 0.45.

The filter transfer function selected for Filter Function Block #3 114 is $$(z^{-2}+1)/2$$

Figure 5:
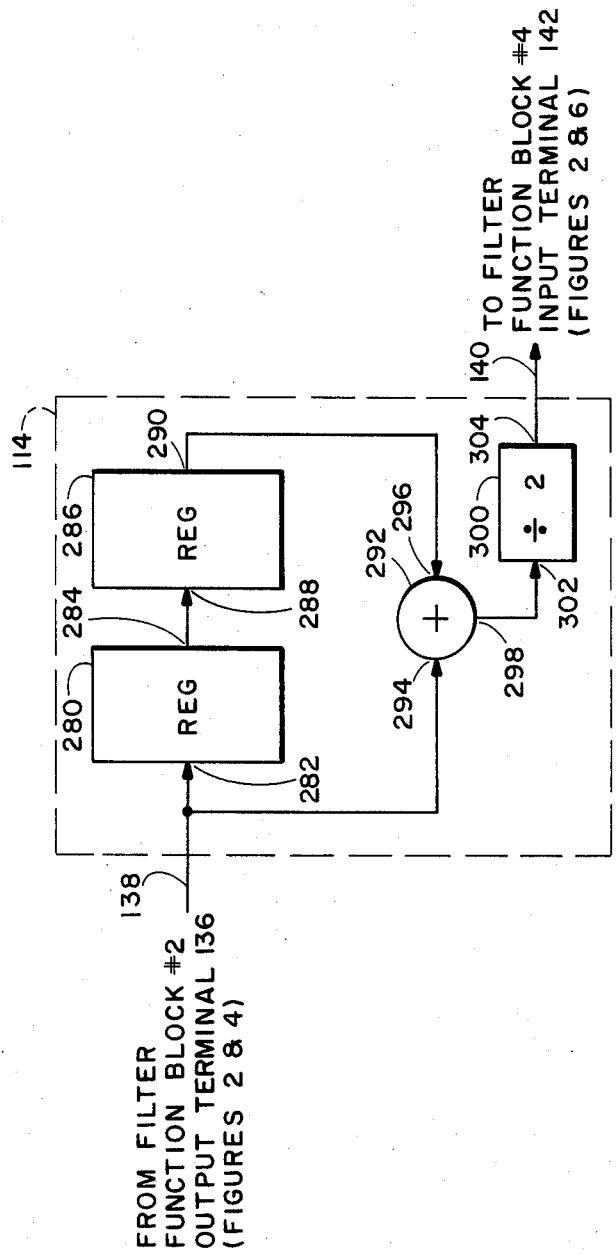
FIG. 5 illustrates a diagram of the implementation of Filter Function Block #3 of FIG. 2.

FIG. 5 illustrates the implementation of Filter Function Block #3 114 in the preferred embodiment. Referring to FIG. 5, Register 280 and 286 have associated therewith input terminals 282 and 288, respectively, and output terminals 284 and 290, respectively. Register 280 and 286 are identical to, and may be implemented in a similar manner as, Register 200 previously discussed with respect to FIG. 3. Adder 292 has associated therewith input terminals 294 and 296, and output terminal 298. Adder 292 is identical to, and may be implemented in a similar manner as, Adder 252 previously discussed with respect to FIG. 4. Divide-by-Two 300 has associated therewith input terminal 302 and output terminal 304, and functions responsive to a digital word coupled to input terminal 302 to produce a digital word representative of the quotient of the representative value of the digital word coupled thereto divided by the integer two. While Divide-by-Two 300 may be implemented by any of a wide variety of digital devices, in the preferred embodiment the function of Divide-by-Two 300 was achieved by shifting the associated bit pattern coupled to input 302 one bit position, as performing same in binary arithtmetic has the identical effect of division by two. The foregoing described apparatus is configured in the following manner. Input terminal 282 of Register 280 is coupled to input terminal 294 of Adder 292, and corresponds to filter function block #3 input terminal 138 (FIG. 2). Output terminal 284 of Register 280 is coupled to input terminal 288 of Register 286. Output terminal 290 of Register 286 is coupled to input terminal 296 of Adder 292. Output terminal 298 of Adder 292 is coupled to input terminal 302 of Divide-by-Two 300. Output terminal 302 of Divide-by-Two 300 corresponds to filter function block #3 output terminal 140 (FIG. 2). The individual frequency response of the foregoing described apparatus of FIG. 5 is that of a comb filter, having a single zero at a normalized frequency of approximately 0.5. The frequency response of the cascaded combination of Filter Function Block #1 110, Filter Function Block #2 112 and Filter Function Block #3 114 at filter function block #3 output terminal 140 is that of a low pass filter having a gain of −10 db at a normalized frequency of approximately 0.32.

The filter transfer function selected for Filter Function Block #4 116 is $$(z^{-6}+2z^{-3}+1)/4$$

Figure 6:
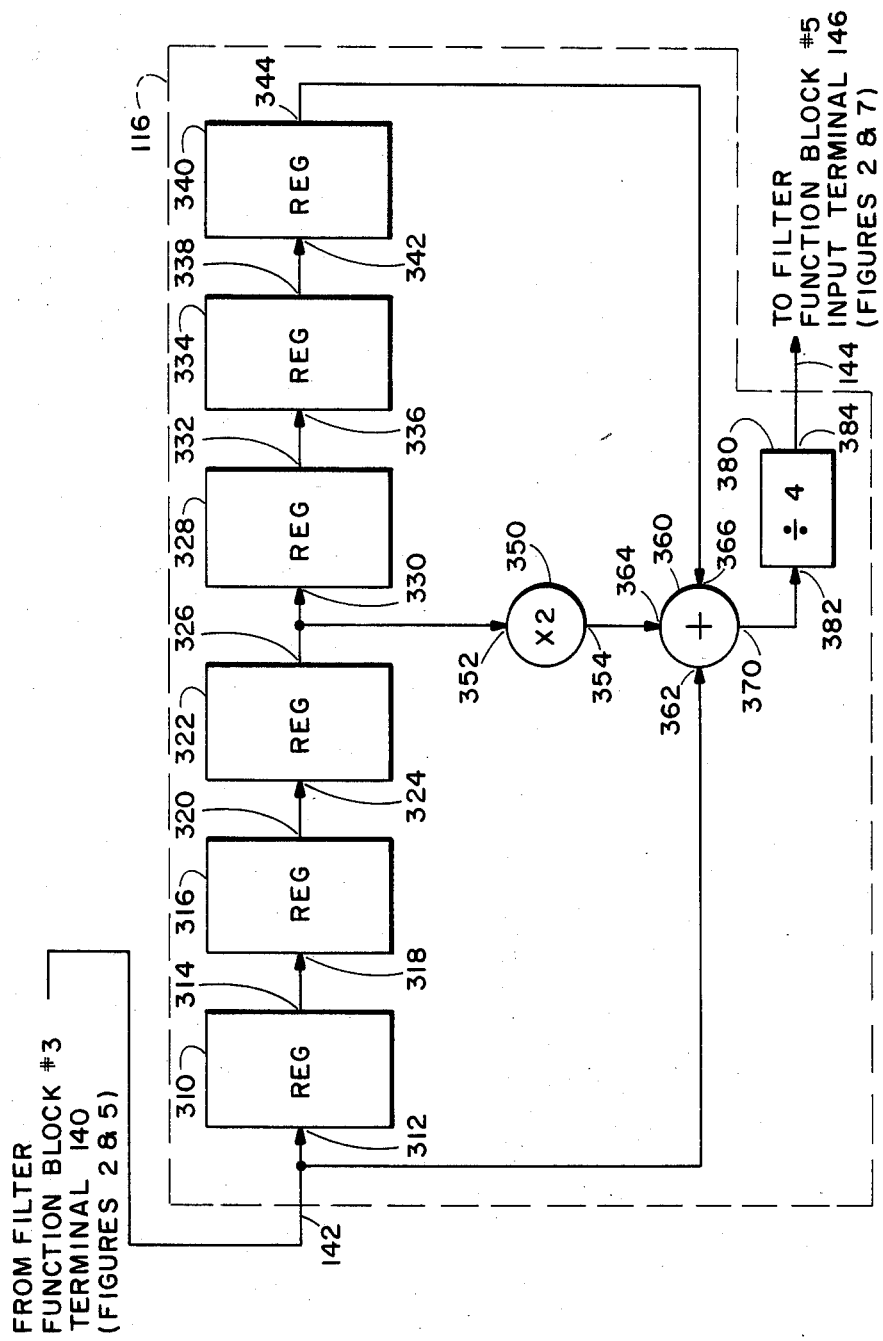
FIG. 6 illustrates a diagram of the implementation of Filter Function Block #4 of FIG. 2.

FIG. 6 illustrates the implementation of Filter Function Block #4 116 in the preferred embodiment. Referring to FIG. 6, Registers 310, 316, 322, 328, 334 and 340 have associated therewith input terminals 312, 318, 324, 330, 336 and 342, respectively, and output terminals 314, 320, 326, 332, 338 and 344, respectively. Registers 310, 316, 322, 328, 334 and 340 are identical to and may be implemented in a similar manner as, Register 200 previously discussed with respect to FIG. 3. Multiply-by-Two 350 has associated therewith input terminal 352 and output terminal 354, and functions responsive to a digital word coupled to input terminal 352 to couple a digital word representative of the digital product of the representative value of said digital word and the integer two to output terminal 354. While Multiply-by-Two 350 may be implemented by any of a wide variety of digital devices, in the preferred embodiment the function thereof was achieved by shifting the associated bit pattern coupled to input terminal 352 one bit position, as performing same in binary arithmetic has the indentical effect of multiplication by two. Adder 360 has associated therewith input terminals 362, 364 and 366, and output terminal 370, and is identical to, and may be implemented in a similar manner as, Adder 216 previously discussed with respect to FIG. 3. Divide-by-Four 380 has associated therewith input terminal 382 and output terminal 384, and is identical to, and may be implemented in a similar manner as, Divide-by-Four 226 previously discussed with respect to FIG. 3. The foregoing described apparatus of FIG. 6 is configured in the following manner. Input terminal 312 of Register 310 is coupled to input terminal 362 of Adder 360, and corresponds to filter function block #4 input terminal 142 (FIG. 2). Output terminals 314, 320, 326, 332, and 338 of Registers 310, 316, 322, 328, 334, respectively, are coupled to input terminals 318, 324, 330, 336 and 342 of Registers 316, 322, 328, 334, and 340, respectively. Output terminal 326 of Register 322 is further coupled to input terminal 352 of Multiple-by-Two 350. Output terminal 344 of Register 340 is coupled to input terminal 366 of Adder 360. Output terminal 354 of Multiply-by-Two 350 is coupled to input terminal 364 of Adder 360. Output terminal 370 of Adder 360 is coupled to input terminal 382 of Divide-by-Four 380. Output terminal 384 of Divide-by-Four 380 corresponds to filter function block #4 output terminal 144 (FIG. 2). The individual frequency response of the foregoing described apparatus of FIG. 6 is that of a comb filter, having two zeros: one at a normalized frequency of approximately 0.35, and a second at a normalized frequency of approximately 1.0. The frequency response of the cascaded combination of Filter Function Block #1 110, Filter Function Block #2 112, Filter Function Block #3 114 and Filter Function Block #4 116 at filter function block #4 output terminal 144 is that of a low pass filter having a gain of −10 db at a normalized frequency of approximately 0.18.

The filter transfer function selected for Filter Function Block #5 118 is $$(z^{-4}+1)/2$$

Figure 7:
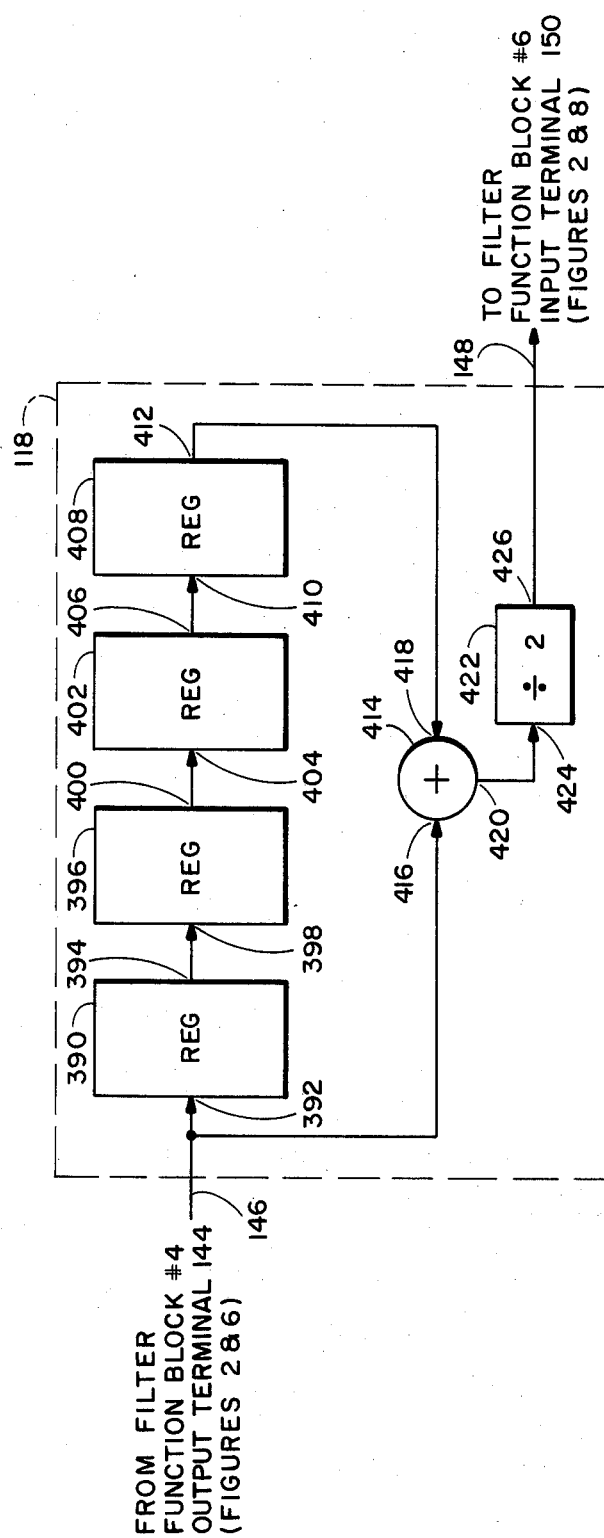
FIG. 7 illustrates a diagram of the implementation of Filter Function Block #5 of FIG. 2.

FIG. 7 illustrates the implementation of Filter Function Block #5 118 in the preferred embodiment. Referring to FIG. 7, Registers 390, 396, 402 and 408 have associated with each an input terminal 392, 398, 404, and 410, respectively, and an output terminal 394, 400, 406 and 412, respectively. Registers 390, 396, 402 and 408 are each identical to, and may be implemented in a similar manner as, Register 200 previously discussed with respect to FIG. 3. Adder 414 has associated therewith input terminals 416 and 418, and output terminal 420, and is identical to, and may be implemented in a similar manner as, Adder 252 previously discussed with respect to FIG. 4. Divide-by-Two 422 has associated therewith input terminal 424 and output terminal 426, and is identical to and may be implemented in a similar manner as Divide-by-Two 300 previously discussed with respect to FIG. 5. The foregoing apparatus of FIG. 7 is configured in the following manner. Input terminal 392 of Register 390 is coupled to input terminal 416 of Adder 414, and corresponds to filter function block #5 input terminal 146 (FIG. 2). Output terminals 394, 400 and 406 of Registers 390, 396 and 402, respectively, are coupled to input terminals 398, 404 and 410 of Registers 396, 402 and 408, respectively. Output terminal 412 of Register 408 is coupled to input terminal 418 of Adder 414. Output terminal 420 of Adder 414 is coupled to input terminal 424 of Divide-by-Two 422. Output terminal 426 of Divide-by-Two 422 corresponds to filter function block #5 output terminal 148 (FIG. 2). The individual frequency response of the foregoing described apparatus of FIG. 7 is that of a comb filter, having two zeros: one at a normalized frequency of approximately 0.24, and a second at a normalized frequency of approximately 0.74. The frequency response of the cascaded combination of Filter Function Block #1 110, Filter Function Block #2 112, Filter Function Block #3 114, Filter Function Block #4 116 and Filter Function Block #5 118 at filter function block #5 output terminal 148 is that of a low pass filter having a gain of −10 db at a normalized frequency of approximately 0.14.

The filter transfer function selected for Filter Function Block #6 120 (FIG. 2) is $$(z^{-8}+1)/2$$

Figure 8:
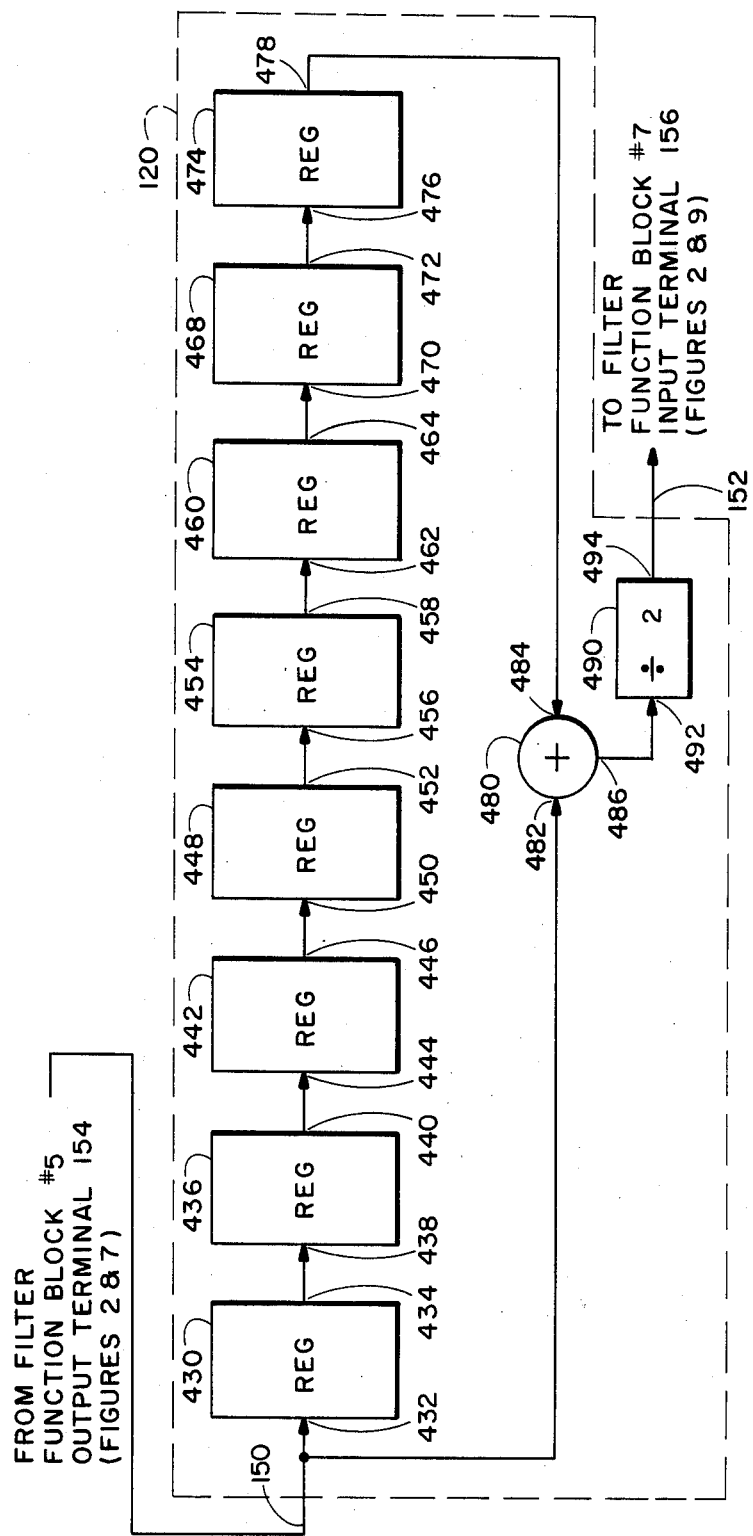
FIG. 8 illustrates a diagram of the implementation of Filter Function Block #6 of FIG. 2.

FIG. 8 illustrates the implementation of Filter Function Block #6 120 in the preferred embodiment. Referring to FIG. 8, Registers 430, 436, 442, 448, 454, 460, 468 and 474 each have an associated input terminal 432, 438, 444, 450, 456, 462, 470 and 476, respectively, and an output terminal 434, 440, 446, 452, 458, 464, 472 and 478, respectively. Each of Registers 430, 436, 442, 448, 454, 460, 468 and 474 are identical to, and may be implemented in a similar fashion as, Register 200 previously discussed with respect to FIG. 3. Adder 480 has associated therewith input terminals 482 and 484, and output terminal 486. Adder 480 is identical to, and may be implemented in a similar fashion as, Adder 252 previously discussed with respect to FIG. 4. Divide-by-Two 490 has associated therewith input terminal 492 and output terminal 494, and is identical to and may be implemented in a similar manner as, Divide-by-Two 300 previously discussed with respect to FIG. 5. The foregoing described apparatus is configured in the following manner. Input terminal 432 of Register 430 is coupled to input terminal 482 of Adder 480, and corresponds to filter function block #6 input terminal 150 (FIG. 2). Output terminals 434, 440, 446, 452, 458, 464, and 472 of Registers 430, 436, 442, 448, 454, 460, and 468, respectively, are coupled to the input terminals 438, 444, 450, 456, 462, 470 and 476 of Registers 436, 442, 448, 454, 460, 468 and 474, respectively. Output terminal 478 of Register 474 is coupled to input terminal 484 of Adder 480. Output terminal 486 of Adder 480 is coupled to input terminal 492 of Divide-by-Two 490. Output terminal 494 of Divide-by-Two 490 corresponds to filter function block #6 output terminal 152 (FIG. 2). The individual frequency response of the foregoing described apparatus of FIG. 8 is that of a comb filter, and has four zeros: one at a normalized frequency of approximately 0.12, a second at a normalized frequency of approximately 0.38, a third at a normalized frequency of approximately 0.62, and a fourth at a normalized frequency of approximately 0.88. The frequency response of the cascaded combination of Filter Function Block #1 110, Filter Function Block #2 112, Filter Function Block #3 114, Filter Function Block #4 116, Filter Function Block #5 118 and Filter Function Block #6 #120 at filter function block #6 output terminal #152 is that of a low pass filter having a gain of −10 db at a normalized frequency of approximately 0.08.

The filter transfer function selected for Filter Function Block #7 122 (FIG. 2) is $$(z^{-12}+1)/2$$

Figure 9:
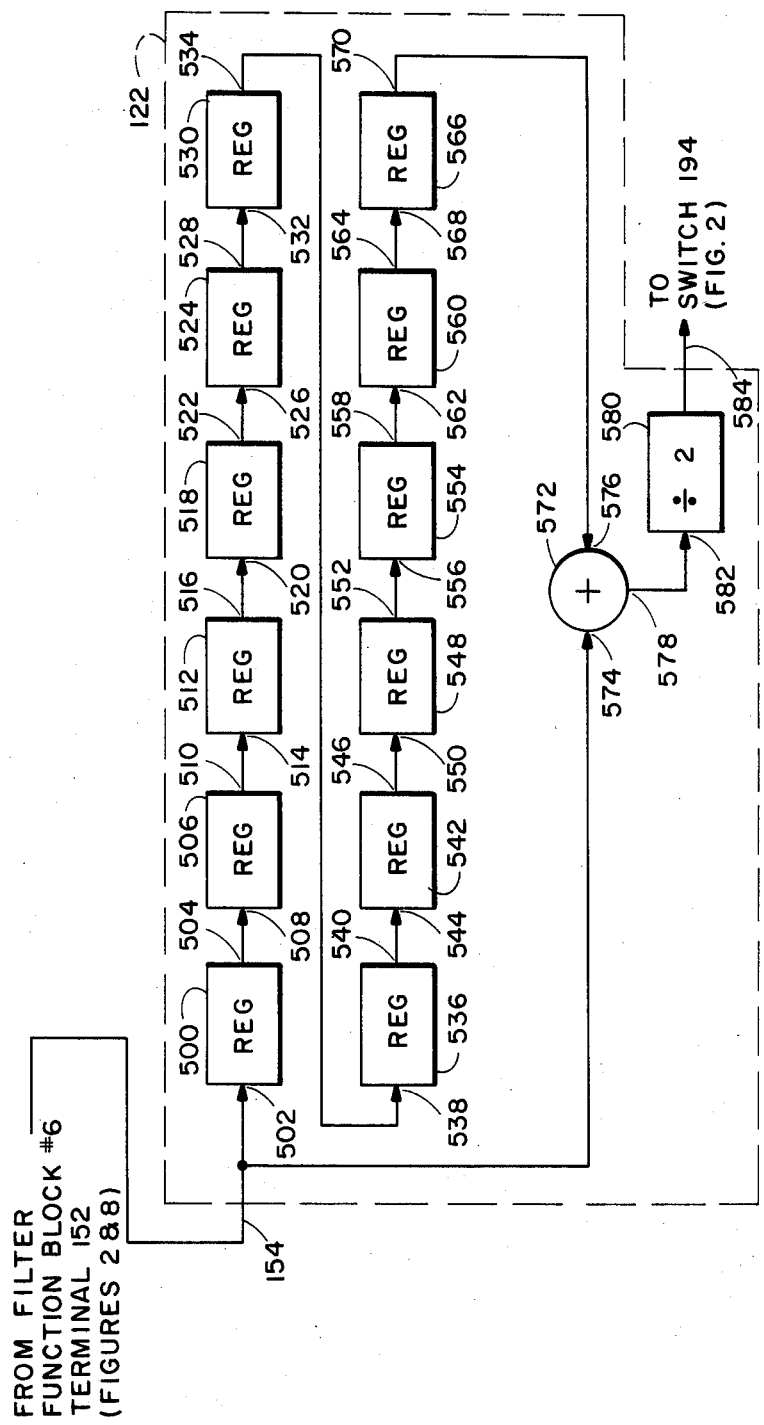
FIG. 9 illustrates a diagram of the implementation of Filter Function Block #7 of FIG. 2.

FIG. 9 illustrates the implementation of Filter Function Block #7 122 in the preferred embodiment. Referring to FIG. 9, Registers 500, 506, 512, 518, 524, 530, 536, 542, 548, 554, 560, and 566 each have an associated input terminal 502, 508, 514, 520, 526, 532, 538, 544, 550, 556, 562 and 568, respectively, and a corresponding output terminal 504, 510, 516, 522, 528, 534, 540, 546, 552, 558, 564 and 570, respectively. The foregoing described register are each identical to, and may be implemented in a similar manner as, Register 200 previously discussed with respect to FIG. 3. Adder 572 has associated therewith input terminals 574 and 576, and output terminal 578, and is identical to, and may be implemented in a similar manner as, Adder 252 previously discussed with respect to FIG. 4. Divide-by-Two 580 has associated therewith input terminal 582 and output terminal 584, and is identical to and may be implemented in a similar manner as Divide-by-Two 300 previously discussed with respect to FIG. 5. The foregoing described apparatus of FIG. 9 is configured in the following manner. Input terminal 502 of Register 500 is coupled to input terminal 574 of Adder 572, and corresponds to filter function block #7 input terminal 154 (FIG. 2). Output terminals 504, 510, 516, 522, 528, 534, 540, 546, 552, 558 and 564, respectively, of Registers 500, 506, 512, 518, 524, 530, 536, 542, 548, 554, and 560, respectively, are coupled to input terminals 508, 514, 520, 526, 532, 538, 544, 550, 556, 562 and 568, respectively of Registers 506, 512, 518, 524, 530, 536, 542, 548, 554, 560 and 566, respectively. Output terminal 570 of Register 566 is coupled to input terminal 576 of Adder 572. Output terminal 578 of Adder 572 is coupled to input terminal 582 of Divide-by-Two 580. Output terminal 584 of Divide-by-Two 580 corresponds to filter function block #7 output terminal 156 (FIG. 2). The individual frequency response of the foregoing described apparatus of FIG. 9 is that of a comb filter, and has six zeros: located at normalized frequencies of approximately 0.08, 0.25, 0.42, 0.58, 0.75 and 0.92. The frequency response of the cascaded combination of Filter Function Block #1 110, Filter Function Block #2 112, Filter Function Block #3 114, Filter Function Block #4 116, Filter Function Block #5 118, Filter Function Block #6 #120 and Filter Function Block #7 122 at filter function block #7 output terminal 156 is that of a low pass filter having a gain of −10 cb at a normalized frequency of approximately 0.05.

Returning now to FIG. 2, each of Delay #1 172, Delay #2 160, Delay #3 162, Delay #4 164, Delay #5 166, Delay #6 168 and Delay #7 170 may be implemented by any of a wide variety of delay devices well known to one of ordinary skill in the art, including the use of the Model 74F374 Delay integrated circuit manufactured by Fairchild Digital Products, or the Model TDC1011 Variable Length 8-Bit Shift Register integrated circuit manufactured by TRW Electronic Components Group of La Jolla, Calif. Each of Switch 180, 182, 184, 186, 188, 190, 192 and 194 may likewise be implemented by any of a wide variety of switching devices well known to one of ordinary skill in the art. Mixer 90 may likewise be implemented by any of a wide variety of mixing devices well known to one of ordinary skill in the art, including the use of Model 74F382 Arithmetic Logic Unit integrated circuit manufactured by Fairchild Digital Products, the Model 29520 4-Stage Pipeline Register integrated circuit manufactured by Advanced Micro Devices of Sunnyvale, Calif., and the Model MPY112K 12-Bit By 12-Bit Digital Multiplier integrated circuit manufactured by TRW Electronic Components Group. In this regard, in the aforedescribed preferred embodiment, the function of Mixer 90 was implemented according to $$\text{Filter Output Signal} = a(A-B) + B \quad (2)$$

where "a", A and B correspond to the variables previously discussed with respect to Equation (1). While Equation (2) is mathematically equivalent to Equation (1), Equation (2) is preferred due to the fact that implementation of Equation (2) requires only a signgle multipling device, whereas implementation of Equation (1) requires the use of two multipling devices.

Figure 10:
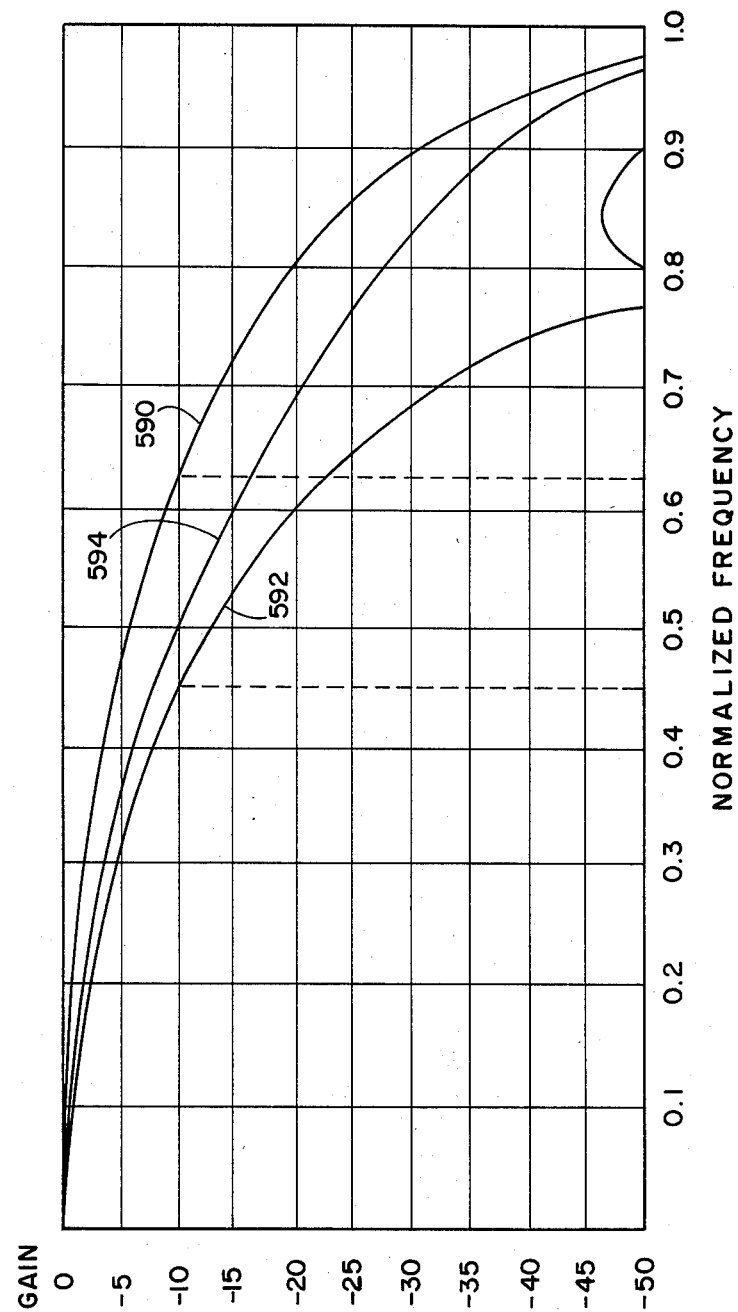
FIG. 10 illustrates several frequency response curves associated with the apparatus of FIG. 2.

According to the method and apparatus of the present invention as above discussed, a low pass filter having a pass band between that of the first filter function block, i.e., the response from filter function #1 output terminal 132, and the cascaded combination of the sequence of all of the filter function blocks employed, i.e., the cascaded response from filter function #7 output terminal 156, may be attained. In particular, in response to a desired pass band, the corresponding filter function blocks having an output response that is over filtered and the adjacent filter function block having an output response which is under filtered are selected and coupled to the respective inputs of Mixer 90. Thereafter, a mix ratio is coupled to mixing ratio input terminal 96 according to the desired pass band. The foregoing may be better understood by way of an illustrative example wherein a desired low pass filter having a frequency response attenuated by −10 db at a normalized frequency of 0.5 is a desired. Referring to FIG. 10, response curve 590 illustrates the low pass filter characteristics of Filter Function Block #1 as observed from filter function block #1 output terminal 132. In this regard, response curve 590 is that of a low pass filter having a response reduced by −10 at a normalized frequency of approximately 0.62, as previously discussed. In a similar manner, response curve 592 illustrates the low pass filter characteristics of the cascaded combination of Filter Function Block #1 110 and Filter Function Block #2 112 as observed on filter function #2 output terminal 136. In this regard, response curve 592 is that of a low pass filter having a response reduced by −10 db at a normalized frequency of approximately 0.45, as previously discussed. According to the present invention, the foregoing described signals, i.e. the signal from filter function block #1 output terminal 132 delayed by Delay #2 160 and the signal from filter function block #2 output terminal 136 delayed by Delay #3 162 are combined by Mixer 90 according to a selected mix ratio coupled to mixing ratio input terminal 96 of Mixer 90. In the illustrative example of FIG. 10, a mix ratio of 0.67 coupled to mixing ratio input terminal 96 of Mixer 90 results in a filter output signal 100 from mixer output terminal 98 of Mixer 90 having a low pass response which is reduced by an amount of −10 db at a normalized frequency of 0.5, as illustrated in response curve 594 of FIG. 10. From the foregoing it is understood that other low pass frequency response characteristics between response curve 590 and response curve 592 may be likewise achieved by changing the mix ratio coupled to mixing ratio input terminal 96 of Mixer 90. Consequently it is understood that a low pass filter having any desired passband between that of Filter Function Block #1 110 and Filter Function Block #7 122 may be similarly achieved by coupling the output terminals of the adjacent filter function blocks having the corresponding over filtered and under filtered response to Mixer 90, and thereafter selecting the particular response therebetween by the numeric value chosen for the mix ratio coupled to mixing ratio input terminal 96 of Mixer 90. The numerical value necessary for a selected filter characteristic may be determined by either empirical or numerical methods well known to one of ordinary skill in the art.

While the foregoing has described a particular embodiment of a low pass filter having selected characteristics, it is to be understood that the apparatus and method of the present invention may be likewise applied to achieve a broad range of filter characteristics. Consequently, the foregoing description of a preferred embodiment incorporating the method and apparatus of the present invention is not to be considered as limiting thereof.

I claim:

1. An apparatus for transforming an input signal into an output signal having selected characteristics comprising:
   means for variably filtering the input signal, the filtering means having a plurality of filter output signals including a final filter output signal;
   means for individually delaying the input signal and the filter output signals except the final filter output signal, the delaying means producing a plurality of delayed filter output signals which are coincident with the final filter output signal;
   means for selectively combining the delayed filter output signals and the final filter output signal, the combining means producing a pair of combined output signals; and
   means for proportionally mixing the combined output signals to produce the output signal.

2. An apparatus as recited in claim 1 wherein the variably filtering means comprises a plurality of filters connected in cascade, each filter having a unique linear phase filter characteristic, the output of each filter being one of the filter output signals and the output of the last filter in the cascade being the final filter output signal.

3. An apparatus as recited in claim 1 wherein the selectively combining means comprises a plurality of switches for selectively connecting the delayed filter output signals and the final filter output signal to one of two data buses, the data buses effectively summing the signals connected to them by the switches to produce the pair of combined output signals.

4. An apparatus as recited in claim 1 wherein the mixing means comprises a mixer having the pair of combined output singnals as inputs together with a mix ratio signal to produce the output signal according to the equation:

$$\text{output signal} = a(A - B) + B$$

where a is the ratio signal, A is one of the pair of combined output signals and B is the other one of the pair of combined output signals.

5. Apparatus responsive to an input signal for producing an output signal having selected characteristics, comprising:
   a plurality of filter function block means, each having an input terminal and an output terminal, configured in a cascaded sequence wherein the input terminal of a first filter function block means is disposed to receive the input signal, and the input terminal of each subsequent filter function block means is coupled to the output terminal of the preceeding filter function block means, each filter function block means for performing a filtering operation on a signal coupled to the input terminal thereof according to a preselected filtering function having a linear phase response, and for coupling the result thereof to the output terminal connected therewith;
   a plurality of delay means, each of said delay means having an input and an output terminal with each input terminal coupled to the input terminal of a corresponding one of said plurality of filter function block means, each of said delay means for producing on its output terminal a signal equivalent to a signal coupled to the correspondings input terminal subsequent to the expiration of a predetermined period of time, the predetermined period of time selected for each delay means so that the signals coupled to the output terminals of each of the plurality of delay means occur coincident with one another;
   mixing means having a first and second input signal terminal, an output terminal and a mix ratio input terminal for combining a first signal coupled to the first input signal terminal with a second signal coupled to the second signal input terminal in response to a signal coupled to the mix ratio input terminal to produce the output signal on the output terminal thereof; and
   coupling means for selectively coupling the output terminal of a selected delay means to the first signal terminal of said mixing means, and for coupling the output terminal of the next succeeding delay means to the second input signal terminal of said mixing means.

6. Apparatus as recited in claim 5, wherein said coupling means further comprises means for selectively coupling the output terminal of the last filter function block means of the plurality of cascaded filter function block means to the first signal input terminal of said mixing means, and for coupling the output terminal of the delay means coupled to the input of the last filter function block means to the second signal input terminal of said mixing means.

7. Apparatus responsive to an input signal for producing an output signal having selected characteristics, comprising:
   a first, second, third, fourth, fifth, sixth and seventh filter function block means, each of said filter function block means having an input terminal and an output terminal, configured in a cascaded sequence wherein the input terminal of a first filter function block means is disposed to receive the input signal, and the input terminal of each subsequent filter function block means is coupled to the output terminal of the preceeding filter function block means, each of said filter function block means for performing a filtering operation on a signal coupled to the input terminal thereof according to a preselected filtering function having a linear phase response, and for coupling the result thereof to the output terminal connected therewith;
   a first, second, third, fourth, fifth, sixth and seventh delay means, each of said delay means having an input and an output terminal connected therewith for producing on its output terminal a signal equivalent to a signal coupled to the input terminal connected therewith subsequent to the expiration of a predetermined period of time, the predetermined period of time selected for each delay means so that the signals coupled to the output terminals of each of said delay means occur coincident with one another, the first delay means input terminal being coupled to the input terminal of the first filter function block means, the second delay means input terminal being coupled to the input terminal of the second filter function block means, the third delay means input terminal being coupled to the input terminal of the third filter function block means, the fourth delay means input terminal being coupled to the input terminal of the fourth filter function block means, the fifth delay means input terminal being coupled to the input terminal of the fifth filter function block means, the sixth delay means input terminal being coupled to the input terminal of the sixth filter function block means and the seventh delay means input terminal being coupled to the input terminal of the seventh filter function block means;

mixing means having a first and a second input signal terminal, an output terminal and a mix ratio input terminal for combining a first signal coupled to the first input signal terminal with a second signal coupled to the second input signal terminal in response to a signal coupled to the mix ratio input terminal to produce the output signal on the output terminal thereof;

a first set of coupling means for selectively coupling the output terminals of the first, third, fifth and seventh delay means to the first input signal terminal of said mixing means; and a second set of coupling means for selectively coupling the output terminals of the second, fourth and sixth delay means and the output terminal of the seventh filter function block means to the second input signal terminal of said mixing means.

8. Apparatus as recited in claim 7, wherein the transfer function of the first filter function block means is $(z^{-2}+2z^{-1}+1)/4.$ 9. Apparatus as recited in claim 7, wherein the first filter function block means further comprises:
a first and second register means, each of said register means having an input and an output terminal, and each of said register means operating to delay a signal coupled to the input terminal thereof by a preselected period of time, the input terminal of said first register means corresponding to the input terminal of the first filter function means, and the output terminal of said first register means coupled to the input terminal of said second register means;
a multiplier means having an input and an output terminal for producing on the output terminal a product signal equal to a signal coupled to the input terminal thereof multiplied by two, with the output terminal of said first register means coupled to the input terminal of said multiplier means;
summing means having first, second and third input terminals and output terminal for producing on the output terminal a signal equal to the sum of signals coupled to the first, second and third input terminals thereof, with the input terminal of the first register means coupled to the first input terminal, the output terminal of said multiplier means coupled to the second input terminal, and the output terminal of the second register means coupled to the third input terminal; and
divider means having an input and an output terminal for producing on the output terminal a divisor signal equal to a signal coupled to the input terminal thereof divided by four, with the input terminal of said divider means coupled to the output terminal of said divider means corresponding to the output terminal of said first filter function block means.

10. Apparatus as recited in claim 7, wherein the transfer function of the second filter function block means is $(z^{-2}+1.5z^{-1}+1)/3.5.$ 11. Apparatus as recited in claim 7, wherein the second filter function block means further comprises:
a first and second register means, each of said register means having an input and an output terminal, and each of said register means operating to delay a signal coupled to the input terminal thereof by a preselected period of time, the input terminal of said first register means corresponding to the input terminal of the second filter function means, and the output terminal of said first register means coupled to the input terminal of said second register means;
a first summing means having a first and second input terminal and an output terminal for producing on the output terminal a signal equal to the sum of signals coupled to the first and second input terminals thereof, with the output terminal of the first register means coupled to the first input terminal of said first summing means;
first divider means having an input and an output terminal for producing on the output terminal a first divisor signal equal to a signal coupled to the input terminal thereof divided by two, with the output terminal of said first register means coupled to the input terminal of said first divider means, and the output terminal of said first divider means coupled to the second input terminal of said first summing means;
a second summing means having first, second and third input terminals and an output terminal for producing on the output terminal a signal equal to the sum of signals coupled to the first, second and third input terminals thereof, with the input terminal of said first register means coupled to the first input terminal of said second summing means, the output terminal of said first summing means coupled to the second input terminal of said second summing means, and the output of said second register means coupled to the third input of said second summing means; and
second divider means having an input and an output terminal for producing on the output terminal a second divisor signal equal to a signal coupled to the input terminal thereof divided by three and one-half, with the input terminal thereof coupled to the output terminal of said second summing means, and the output terminal of said second divider means corresponding to the output terminal of said second filter function block means.

12. Apparatus as recited in claim 7, wherein the transfer function of the third filter function block means is $(z^{-2}+1)/2.$ 13. Apparatus as recited in claim 7, wherein the third filter function block means further comprises:
a first and second register means, each of said register means having an input and an output terminal, and each of said register means operating to delay a signal coupled to the input terminal thereof by a preselected period of time, the input terminal of said first register means corresponding to the input terminal of the third filter function means, and the output terminal of said first register means coupled to the input terminal of said second register means;

summing means having a first and a second input terminal and an output terminal for producing on the output terminal thereof a signal equal to the sum of signals coupled to the first and second input terminals thereof, with the first input terminal coupled to the input terminal of said first register means, and the second input terminal coupled to the output terminal of said second register means; and divider means having an input and an output terminal for producing on the output terminal a divisor signal equal to a signal coupled to the input terminal thereof divided by two, with the input terminal of said divider means coupled to the output terminal of said summing means, and the output terminal of said divider means corresponding to the output terminal of said third filter function block means.

14. Apparatus as recited in claim 7, wherein the transfer function of the fourth filter function block means is $$(z^{-6}+2z^{-3}+1)/4.$$

15. Apparatus as recited in claim 7, wherein the fourth filter function block means further comprises:

a first, second, third, fourth, fifth and sixth register means, each of said register means having an input and an output terminal, and each of said register means operating to delay a signal coupled to the input terminal thereof by a preselected period of time, the input terminal of the first register means corresponding to the input terminal of the fourth filter function means, and the output terminal of the first, second, third, fourth and fifth register means being coupled to the input terminal of the second, third, fourth, fifth and sixth register means, respectively;

multiplier means having an input and an output terminal for producing on the output terminal thereof a product signal equal to a signal coupled to the input terminal thereof multiplied by two, with the output terminal of said third register means coupled to the input terminal of said multiplier means;

summing means having first, second and third input terminals and an output terminal for producing on the output terminal a signal equal to the sum of signals coupled to the first, second and third input terminals thereof, with the input terminal of the first register means being coupled to the first input terminal of said summing means, the output terminal of said multiplier means being coupled to the second input terminal of said summing means and the output terminal of the sixth register means being coupled to the third input terminal of said summing means; and divider means having an input and an output terminal for producing on the output terminal a divisor signal equal to a signal coupled to the input terminal thereof divided by four, with the input terminal of said divider means coupled to the output terminal of said summing means, and the output terminal of said divider means corresponding to the output terminal of said fourth filter function block means.

16. Apparatus as recited in claim 7, wherein the transfer function of the fifth filter function block means is $$(z^{-4}+1)/2.$$

17. Apparatus as recited in claim 7, wherein the fifth filter function block means further comprises:

a first, second, third and fourth register means, each of said register means having an input and an output terminal, and each of said register means operating to delay a signal coupled to the input terminal thereof by a preselected period of time, the input terminal of said first register means corresponding to the input terminal of the fifth filter function block means, and the output terminal of the first, second and third register means being coupled to the input terminal of the second, third and fourth register means, respectively;

summing means having a first and second input terminal and an output terminal for producing on the output terminal a signal equal to the sum of signals coupled to the first and second input terminals thereof, with the input terminal of the first register means being coupled to the first input terminal of said summing means and the output terminal of the fourth register means being coupled to the second input terminal of said summing means; and divider means having an input and an output terminal for producing on the output terminal a divisor signal equal to a signal coupled to the input terminal thereof divided by two, with the output terminal of said summing means coupled to the input terminal of said divider means, and the output terminal of said divider means corresponding to the output terminal of said fifth filter function block means.

18. Apparatus as recited in claim 7, wherein the transfer function of the sixth filter function block means is $$(z^{-8}+1)/2.$$

19. Apparatus as recited in claim 7, wherein the sixth filter function block means further comprises:

a first, second, third, fourth, fifth, sixth, seventh and eighth register means, each of said register means having an input and an output terminal, and each of said register means operating to delay a signal coupled to the input terminal thereof by a preselected period of time, the input terminal of said first register means corresponding to the input terminal of the sixth filter function block means, and the output terminal of the first, second, third, fourth, fifth, sixth and seventh register means being coupled to the input terminal of the second, third, fourth, fifth, sixth, seventh and eighth register means, respectively;

summing means having first and second input terminals and an output terminal for producing on the output terminal a signal equal to the sum of signals coupled to the first and second input terminals thereof, with the input terminal of the first register means being coupled to the first input terminal of said summing means, and the output terminal of the eighth register means being coupled to the second input terminal of said summing means; and divider means having an input and an output terminal for producing on the output terminal a divisor signal equal to a signal coupled to the input terminal thereof divided by two, with the output terminal of said summing means coupled to the input terminal of said divider means corresponding to the output terminal of said sixth filter function block means.

20. Apparatus as recited in claim 7, wherein the transfer function of the seventh filter function block means is $$(z^{-12}+1)/2.$$

21. Apparatus as recited in claim 7, wherein the seventh filter function block means further comprises:

a first, second, third, fourth, fifth, sixth, seventh, eighth, ninth, tenth, eleventh and twelfth register means, each of said register means having an input and an output terminal, and each of said register means operating to delay a signal coupled to the input terminal thereof by a preselected period of time, the input terminal of said first register means corresponding to the input terminal of the seventh filter function block means, and the output terminal of the first, second, third, fourth, fifty, sixth, seventh, eighth, ninth, tenth and eleventh register means being coupled to the input terminal of the second, third, fourth, fifth, sixth, seventh, eighth, ninth, tenth, eleventh and twelfth register means, respectively;

summing means having a first and second input terminal and an output terminal for producing on the output terminal a signal equal to the sum of signals coupled to the first and second input terminals thereof, with the input terminal of the first register means being coupled to the first input terminal of said summing means, and the output terminal of the twelfth register means being coupled to the second input terminal of said summing means; and divider means having an input and an output terminal for producing on the output terminal a divisor signal equal to a signal coupled to the input terminal thereof divided by two, with the output terminal of said summing means coupled to the input terminal of said divider means, and the output terminal of said divider means corresponding to the output terminal of said seventh filter block means.

* * * * *